United States Patent
Zhang et al.

(10) Patent No.: US 12,352,797 B2
(45) Date of Patent: Jul. 8, 2025

(54) ONLINE MONITORING METHOD FOR INSULATION STATE OF CABLE FOR TRANSFORMER SUBSTATION

(71) Applicant: HUIZHOU POWER SUPPLY BUREAU OF GUANGDONG POWER GRID CO., LTD., Huizhou (CN)

(72) Inventors: Daxing Zhang, Huizhou (CN); Zerong Huang, Huizhou (CN); Xingguang Yin, Huizhou (CN); Bingzi Cai, Huizhou (CN); Haoyu Yuan, Huizhou (CN); Mingming Tian, Huizhou (CN); Zeji Li, Huizhou (CN); Juhan Wang, Huizhou (CN); Yingping Yuan, Huizhou (CN); Zhenxing Wen, Huizhou (CN)

(73) Assignee: HUIZHOU POWER SUPPLY BUREAU OF GUANDONG POWER GRID CO., LTD., Huizhou (CN)

( * ) Notice: Subject to any disclaimer, the term of this patent is extended or adjusted under 35 U.S.C. 154(b) by 0 days.

(21) Appl. No.: 18/844,509

(22) PCT Filed: Feb. 20, 2023

(86) PCT No.: PCT/CN2023/077062
§ 371 (c)(1),
(2) Date: Sep. 6, 2024

(87) PCT Pub. No.: WO2023/179265
PCT Pub. Date: Sep. 28, 2023

(65) Prior Publication Data
US 2025/0110166 A1  Apr. 3, 2025

(30) Foreign Application Priority Data
Mar. 23, 2022 (CN) .......................... 202210284917.3

(51) Int. Cl.
*G01R 31/08* (2020.01)
*G01R 31/11* (2006.01)
(Continued)

(52) U.S. Cl.
CPC ......... *G01R 31/083* (2013.01); *G01R 31/086* (2013.01); *G01R 31/088* (2013.01);
(Continued)

(58) Field of Classification Search
CPC .... G01R 31/083; G01R 31/11; G01R 31/086; G01R 31/088; G01R 31/1272; G01R 31/58
(Continued)

(56) References Cited

U.S. PATENT DOCUMENTS

2002/0025520 A1* 2/2002 Chee .................... C12Q 1/6874
536/23.1
2004/0096216 A1* 5/2004 Ito ...................... H04B 10/0775
398/33
(Continued)

FOREIGN PATENT DOCUMENTS

CN    103684699 A    3/2014
CN    104090214 A    10/2014
(Continued)

OTHER PUBLICATIONS

1st Chinese Office Action for Chinese Application No. 202210284917.3, dated Apr. 29, 2022 (Apr. 29, 2022)—4 pages (English translation—4 pages).
(Continued)

*Primary Examiner* — Raul J Rios Russo
(74) *Attorney, Agent, or Firm* — CM Law; Stephen J. Weed

(57) ABSTRACT

An online monitoring method for insulation status of substation utility cables is provided. The method includes that
(Continued)

two ends of a to-be-monitored cable are connected to a primary monitoring device and a secondary monitoring device by using a first coupler and a second coupler respectively; and the primary monitoring device and the secondary monitoring device each inject a high-frequency test signal into the to-be-monitored cable, collect a high-frequency reflected signal in the to-be-monitored cable, perform signal processing by using a frequency-domain peak iterative search algorithm, and extract reflection point parameter information, and the insulation aging status of the to-be-monitored cable is determined by integrated monitoring parameter information at two ends of the to-be-monitored cable.

9 Claims, 4 Drawing Sheets

(51) Int. Cl.
  *G01R 31/12* (2020.01)
  *G01R 31/58* (2020.01)
(52) U.S. Cl.
  CPC .......... *G01R 31/11* (2013.01); *G01R 31/1272* (2013.01); *G01R 31/58* (2020.01)
(58) Field of Classification Search
  USPC ........................................................ 324/520
  See application file for complete search history.

(56) References Cited

U.S. PATENT DOCUMENTS

| | | | |
|---|---|---|---|
| 2004/0248176 A1* | 12/2004 | Chee .................... | C12Q 1/6874 435/6.11 |
| 2010/0188095 A1* | 7/2010 | Maslen .................. | G01R 31/11 324/533 |
| 2015/0222511 A1* | 8/2015 | Fertner ............... | H04L 43/0864 370/252 |
| 2019/0094289 A1 | 3/2019 | Incarbone et al. | |

FOREIGN PATENT DOCUMENTS

| | | | |
|---|---|---|---|
| CN | 205210228 U | 5/2016 | |
| CN | 107231225 A | 10/2017 | |
| CN | 110247872 A | 9/2019 | |
| CN | 113466612 A | 10/2021 | |
| CN | 113640635 A | 11/2021 | |
| CN | 113687201 A | 11/2021 | |
| CN | 113945801 A | 1/2022 | |
| CN | 114384382 A | 4/2022 | |
| EP | 3199961 A1 | 8/2017 | |

OTHER PUBLICATIONS

International Search Report for International Application No. PCT/CN2023/077062, dated Jun. 20, 2023 (Jun. 20, 2023)—2 pages (English translation—3 pages).

* cited by examiner

ONLINE MONITORING METHOD FOR INSULATION STATE OF CABLE FOR TRANSFORMER SUBSTATION

CROSS-REFERENCE TO RELATED APPLICATIONS

This is a National Stage Application, filed under 35 U.S.C. 371, of International Patent Application No. PCT/CN2023/077062, filed on Feb. 20, 2023, which claims priority to Chinese Patent Application No. 202210284917.3 filed with the China National Intellectual Property Administration (CNIPA) on Mar. 23, 2022, the disclosures of which are incorporated herein by reference in their entireties.

TECHNICAL FIELD

The present application relates to the technical field of secondary power devices, for example, an online monitoring method for insulation status of substation utility cables.

BACKGROUND

With the rapid development of urban construction, power cables, due to their advantages of occupying less space and being more environmentally friendly, have gradually replaced overhead lines to become the main force in urban power transmission and distribution networks. In recent years, there have been several incidents within power grid companies where short circuit faults were caused by reduced insulation of power cables in substations. Since both AC and DC cables are laid together in cable trenches within substations, a short circuit fault in one cable can result in the short circuit current damaging all the cables in the trench, leading to equipment malfunctions and failures. Due to the long transmission distances of cables within substations, numerous branch lines, harsh environmental and climatic conditions, and equipment failures, it is difficult to detect defects through manual infrared temperature measurement, visual inspection, and other such methods. Therefore, achieving online monitoring of the insulation of power cables within substations is of great significance for maintaining the safety and stability of the power grid.

Currently, the main methods for cable fault detection domestically and internationally include offline distance measurement, live detection, and online monitoring. The offline distance measurement method involves shutting down the power and disconnecting the power cables after a fault occurs, and then testing the fault distance by using relevant equipment. This method results in prolonged power outages, impacting social and economic activities. Additionally, the offline detection method requires deploying manpower and resources to find the cause and locate the fault point after the fault has occurred, resulting in a very low efficiency. Live detection methods include the DC component method, dielectric constant method, distributed optical fiber temperature measurement, and live detection of partial discharge. While these methods are feasible in ideal laboratory environments, they often fail to provide satisfactory results in actual field applications. Currently, the online monitoring technology is still in its early stages, and there are relatively few products that have been put into actual operation.

SUMMARY

The present application provides an online monitoring method for insulation status of substation utility cables. The method includes injecting high-frequency test signals at the two ends of a to-be-monitored cable, collecting and analyzing reflected signals, obtaining information such as positions and energy of the reflection points, and comprehensively determining whether the cable undergoes insulation aging and determining the number of aging points, aging types, aging degrees, and aging positions, thereby achieving online monitoring of the insulation status of substation cables.

The present application provides an online monitoring method for insulation status of substation utility cables. The method includes selecting a to-be-monitored cable: connecting one end of the to-be-monitored cable to a primary monitoring device by using a first coupler and connecting the other end of the to-be-monitored cable to a secondary monitoring device by using a second coupler: sending, by the primary monitoring device, a first high-frequency test signal and injecting the first high-frequency test signal into the to-be-monitored cable by using the first coupler: collecting, by the primary monitoring device, a first high-frequency reflected signal in the to-be-monitored cable by using the first coupler, performing signal processing on the first high-frequency reflected signal by using a frequency-domain peak iterative search algorithm, and extracting first reflection point parameter information: sending, by the secondary monitoring device, a second high-frequency test signal and injecting the second high-frequency test signal into the to-be-monitored cable by using the second coupler: collecting, by the secondary monitoring device, a second high-frequency reflected signal in the to-be-monitored cable by using the second coupler, performing signal processing on the second high-frequency reflected signal by using the frequency-domain peak iterative search algorithm, and extracting second reflection point parameter information: performing, by the primary monitoring device and the secondary monitoring device, information interaction, and after the second parameter information is acquired, determining insulation aging status of the to-be-monitored cable; and ending detection.

DETAILED DESCRIPTION

Figure 1:
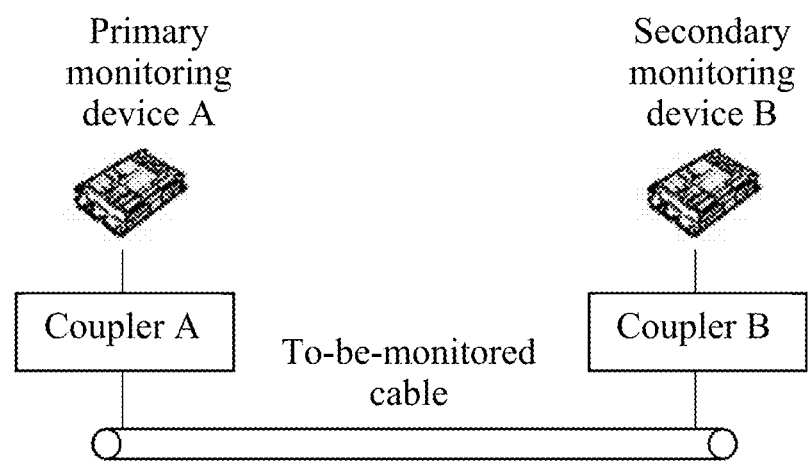
FIG. 1 is a diagram of a cable insulation status monitoring system.

The present application provides an online monitoring method for insulation status of substation utility cables. A diagram of the hardware system corresponding to the method is shown in FIG. 1. The hardware system includes a primary monitoring device A, a secondary monitoring device B, a coupler A, and a coupler B.

The primary monitoring device A is configured to emit a high-frequency test signal, collect and analyze a high-frequency reflected signal, and perform data interaction with the secondary monitoring device B to determine the insulation aging status of a to-be-monitored cable.

The secondary monitoring device B is configured to emit a high-frequency test signal, collect and analyze a high-frequency reflected signal, and perform data interaction with the primary monitoring device A.

Both the coupler A and the coupler B are configured to couple the high-frequency test signal to the to-be-monitored cable and extract the high-frequency reflected signal in the to-be-monitored cable.

Figure 2:
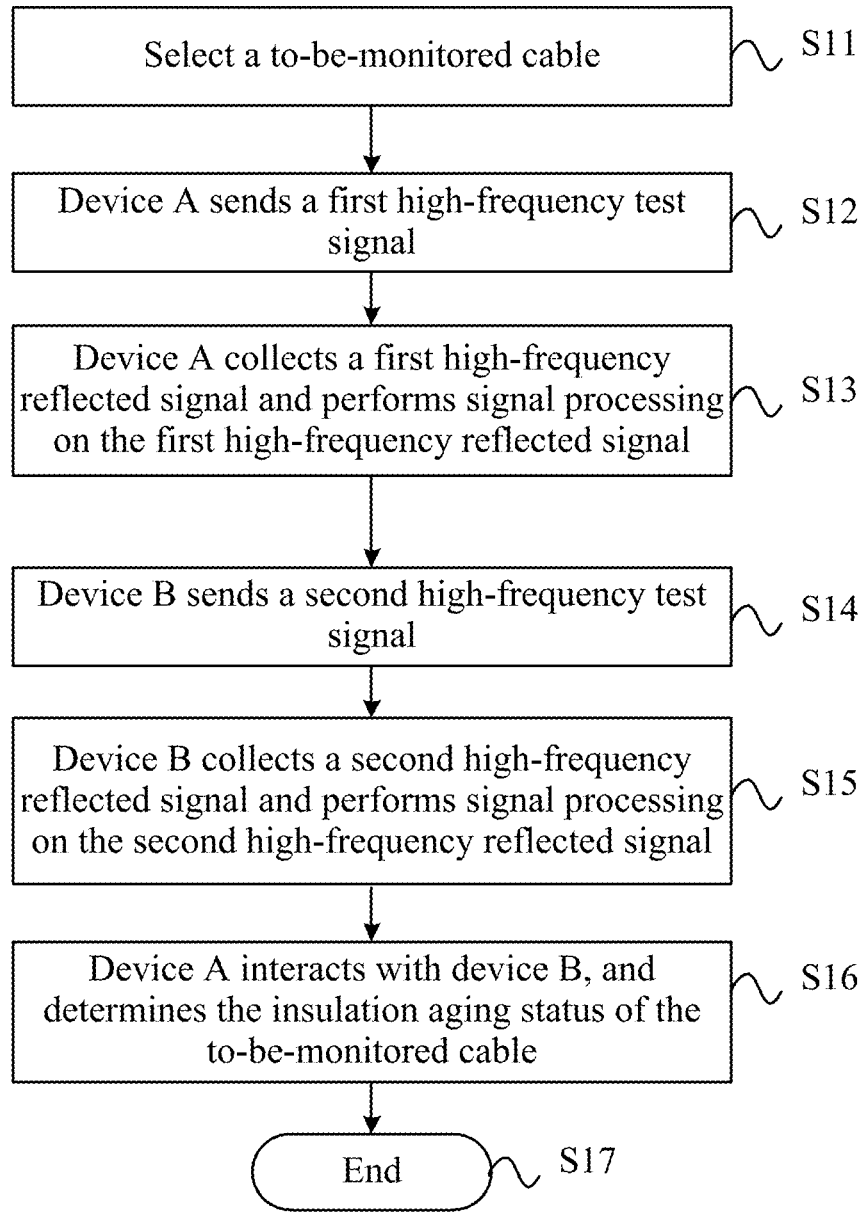
FIG. 2 is a flowchart of determining the insulation aging status of a to-be-monitored cable according to the present application.

The online monitoring method for insulation status of substation utility cables according to the present application has a detection process as shown in FIG. 2. The method includes the following steps:

In S11, a to-be-monitored cable is selected, one end of the to-be-monitored cable is connected to the primary monitoring device A by using the coupler A, and the other end of the to-be-monitored cable is connected to the secondary monitoring device B by using the coupler B.

In S12, the primary monitoring device A sends a first high-frequency test signal and injects the first high-frequency test signal into the to-be-monitored cable by using the coupler A.

In S13, the primary monitoring device A collects a first high-frequency reflected signal in the to-be-monitored cable by using the coupler A, performs signal processing on the first high-frequency reflected signal by using a frequency-domain peak iterative search algorithm, and extracts first reflection point parameter information.

In S14, the secondary monitoring device B sends a second high-frequency test signal and injects the second high-frequency test signal into the to-be-monitored cable by using the coupler B.

In S15, the secondary monitoring device B collects a second high-frequency reflected signal in the to-be-monitored cable by using the coupler B, performs signal processing on the second high-frequency reflected signal by using the frequency-domain peak iterative search algorithm, and extracts second reflection point parameter information.

In S16, the primary monitoring device A and the secondary monitoring device B perform information interaction, and after the second parameter information is acquired, the insulation aging status of the to-be-monitored cable is determined.

In S17, the detection is ended.

After collecting a reflected signal from the to-be-monitored cable, the primary monitoring device A and the secondary monitoring device B perform signal processing on the reflected signal by using the frequency-domain peak iterative search algorithm to acquire the first reflection point parameter information and the second reflection point parameter information. For example, the first parameter information and the second parameter information include, but not limited to, reflection energy information and reflection position information.

Figure 3:
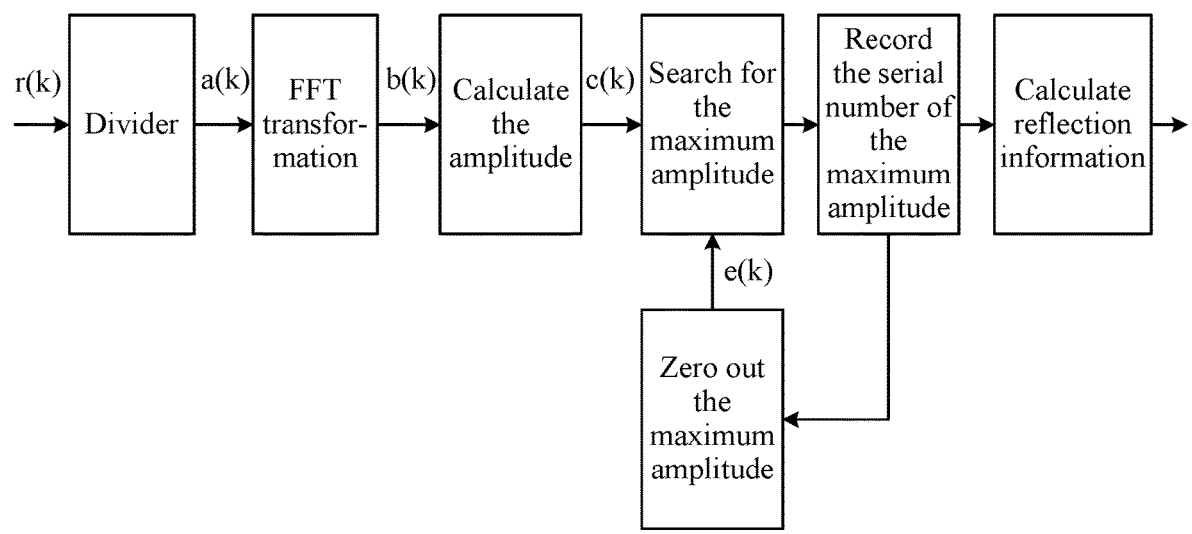
FIG. 3 is a flowchart of the principle of a frequency-domain peak iterative search algorithm according to the present application.

As shown in FIG. 3, the frequency-domain peak iterative search algorithm is as follows:

(1) The first high-frequency reflected signal or the second high-frequency reflected signal is input into a divider for signal processing.

The divider performs the signal processing by using the following formula:

$$a(i) = \frac{r(i)}{s(i)}, \text{ where } i = 1, 2, \ldots N.$$

In the formula, a(i) denotes an $i^{th}$ element of the output sequence of the divider, r(i) denotes the first high-frequency reflected signal or the second high-frequency reflected signal, s(i) denotes an $i^{th}$ element of a sequence of the sent first high-frequency test signal or the sent second high-frequency test signal, i denotes a serial number of an element in the signal sequence, and N denotes the length of the signal sequence.

Then the output of the divider is sent to a Fast Fourier Transform (FFT) module.

(2) The FFT module is configured to convert time-domain data into frequency-domain data by using the following formula:

$$b(k) = \sum_{i=1}^{N-1} a(i) \cdot e^{-j\frac{2\pi}{N}} \quad k = 1, 2, \ldots N.$$

In the formula, b(k) denotes a $k^{th}$ element output by the FFT module, j denotes an imaginary unit, N denotes the length of an output sequence of the FFT module, and N is equal to the length of the sequence of the first high-frequency test signal and the second high-frequency test signal.

(3) The output of the FFT module is sent to an amplitude calculation module, and the amplitude calculation module receives b(k) and performs the following calculation:

$$c(k) = |b(k)| \quad k = 1, 2, \ldots N.$$

In the formula, c(k) denotes a $k^{th}$ element output by the amplitude calculation module, and |·| denotes an amplitude operation.

(4) After the frequency-domain signal amplitude is obtained, two iterative searches are performed to obtain the maximum amplitude and the second largest amplitude in c(k):

$$d(k) = \begin{cases} c(k) & k = 1, 2, \ldots N, \text{First search} \\ e(k) & k = 1, 2, \ldots N, \text{Second search} \end{cases}.$$

The process is as follows:

(a) The maximum amplitude search module performs a first search of amplitudes in c(k) and obtains the first maximum amplitude, and the maximum amplitude number storage module records the serial number of the first maximum amplitude as $l_1$, where $1 \leq l_1 \leq N$.

(b) The maximum amplitude zeroing module zeros out the maximum amplitude by using the following formula:

$$e(k) = \begin{cases} c(k) & k \neq l_1 \\ 0 & k = l_1 \end{cases} \quad k = 1, 2, \ldots N.$$

Then e(k) is output to the maximum amplitude search module.

(c) The maximum amplitude search module performs a second search on e(k) and obtains the second maximum amplitude, and the maximum amplitude number storage module records the serial number of the second maximum amplitude as $l_2$, where $1 \leq l_2 \leq N$.

In the formula, c(k) denotes a $k^{th}$ amplitude output by the amplitude calculation module, |·| denotes an amplitude operation, and e(k) denotes a $k^{th}$ amplitude of an output signal sequence of the maximum amplitude zeroing module.

(5) After the two iterative searches are completed, a reflection information calculation module calculates the first reflection point parameter information or the second reflection point parameter information by using the following formulas:

$$P = (p_1, p_2), \quad \text{Formula 1}$$

and $$G = (g_1, g_2). \quad \text{Formula 2}$$

$p_1$ and $g_1$ are calculated from the serial number $l_1$ recorded after the first search:

$$p_1 = \begin{cases} b(l_1) & c(l_1) \geq T \\ 0 & c(l_1) < T \end{cases},$$

and $$g_1 = \begin{cases} l_1 \times \dfrac{v}{2 \cdot f_s} & c(l_1) \geq T \\ 0 & c(l_1) < T \end{cases}.$$

Formula 3

$p_2$ and $g_2$ are calculated from the serial number $l_2$ recorded after the second search:

$$p_2 = \begin{cases} b(l_2) & c(l_2) \geq T \\ 0 & c(l_2) < T \end{cases},$$

and $$g_2 = \begin{cases} l_2 \times \dfrac{v}{2 \cdot f_s} & c(l_2) \geq T \\ 0 & c(l_2) < T \end{cases}.$$

Based on the preceding calculation, $p_{A1}$ and $p_{B1}$ are substituted into $p_1$, $p_{B2}$ and $p_{A2}$ are substituted into $p_2$, $g_{A1}$ and $g_{B1}$ are substituted into $g_1$, $g_{A2}$ and $g_{B2}$ are substituted into $g_2$, and the following is calculated by using formulas 1 to 3:

The first reflection point parameter information at the primary monitoring device A, including the reflection energy information $P_A$ and reflection position information $G_A$:

$$P_A = (p_{A1}, p_{A2}), \text{ and}$$

$$G_A = (g_{A1}, g_{A2}).$$

The second reflection point parameter information at the secondary monitoring device B, including the reflection energy information $P_B$ and reflection position information $G_B$:

$$P_B = (p_{B1}, p_{B2}), \text{ and}$$

$$G_B = (g_{B1}, g_{B2}).$$

In the formulas, P, $P_A$, and $P_B$ each denote a reflection energy information sequence, $p_1$ and $p_2$ are elements in P, $p_{A1}$ and $p_{A2}$ are elements in $P_A$, and $p_{B1}$ and $p_{B2}$ are elements in PB; G, $G_A$, and $G_B$ each denote a reflection position information sequence, $g_1$ and $g_2$ are elements in G, $g_{A1}$ and $g_{A2}$ are elements in $G_A$, and $g_{B1}$ and $g_{B2}$ are elements in $G_B$; $b(l_1)$ denotes an $l_1^{th}$ element output by the FFT module, $c(l_1)$ denotes an $l_1^{th}$ element output by the amplitude calculation module, T denotes a threshold, v denotes the transmission speed of a high-frequency signal in the cables, and $f_s$ denotes the sampling rate of a device; and $b(l_2)$ denotes the $l_2^{th}$ element output by the FFT module, $c(l_2)$ denotes an $l_2^{th}$ element output by the amplitude calculation module, T denotes the threshold, v denotes the transmission speed of the high-frequency signal in the cable, and $f_s$ denotes the sampling rate of the device.

Figure 4:
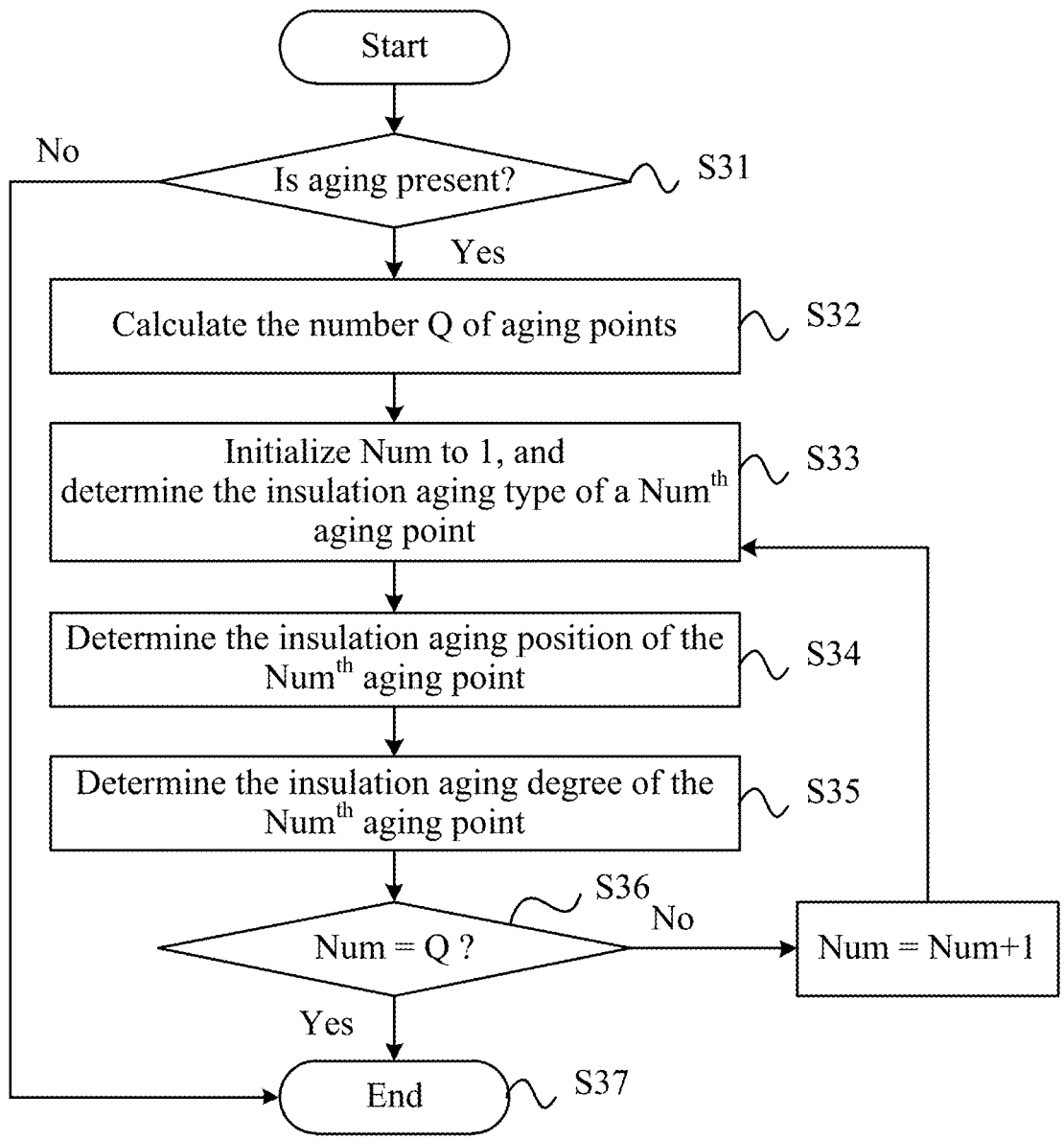
FIG. 4 is a flowchart of determining insulation status by a primary monitoring device A according to the present application.

The primary monitoring device A and the secondary monitoring device B perform interaction, and after information at the secondary monitoring device B is acquired, the insulation status of the to-be-monitored cable is determined. The determination process is shown in FIG. 4.

In S31, it is determined whether the to-be-monitored cable undergoes insulation aging; if the to-be-monitored cable undergoes no insulation aging, S37 is started; and if the to-be-monitored cable undergoes insulation aging, S32 is started.

Whether the to-be-monitored cable undergoes insulation aging is determined by using the following formula:

$$\begin{cases} \text{present,} & g_{A1} < L_c \text{ and } g_{B1} < L_c \\ \text{absent,} & g_{A1} = g_{B1} = L_c \end{cases}.$$

In the formula, $g_{A1}$ denotes the first element in the reflection position information sequence $G_A$ calculated by the primary monitoring device A, $g_{B1}$ denotes the first element in the reflection position information sequence $G_B$ calculated by the secondary monitoring device B, and $L_C$ denotes the length of the to-be-monitored cable.

In S32, when insulation aging exists, the number Q of insulation aging points is determined, and the number Q equal to ΣNum is calculated by using the following formula:

$$Num = \begin{cases} 1 & g_{A1} + g_{B1} = L_C \\ 2 & g_{A1} + g_{B2} = L_C \\ 3 & g_{A2} + g_{B2} = L_C \\ 4 & g_{A2} + g_{B2} < L_C \end{cases}.$$

In the formula, $g_{A1}$ and $g_{A2}$ denote the first element and the second element in the reflection position information sequence $G_A$ calculated by the primary monitoring device A respectively, $g_{B1}$ and $g_{B2}$ denote the first element and the second element in the reflection position information sequence $G_B$ calculated by the secondary monitoring device B respectively, and $L_C$ denotes the length of the to-be-monitored cable.

In S33, after the number of insulation aging points is determined, the insulation aging type of each point is determined. Num is initialized to 1, and the insulation aging type of a Num$^{th}$ aging point is determined by using the following formulas:

If one insulation aging point is present, that is, Num=1, $$H_1 = \begin{cases} \text{low-resistance insulation aging} & p_{A1} + p_{B1} < 0 \\ \text{high-resistance insulation aging} & p_{A1} + p_{B1} > 0 \end{cases}.$$

In the formula, $H_1$ denotes the insulation aging type of the point closest to the primary monitoring device A, $p_{A1}$ denotes the first element in the reflection energy information sequence $P_A$ calculated by the primary monitoring device A, and $p_{B1}$ denotes the first element in the reflection energy information sequence $P_B$ calculated by the secondary monitoring device B.

If two insulation aging points are present, that is, Num=2, $$H_1 = \begin{cases} \text{low-resistance insulation aging } p_{A1} < 0 \\ \text{high-resistance insulation aging } p_{A1} > 0 \end{cases};$$

and $$H_2 = \begin{cases} \text{low-resistance insulation aging } p_{B1} < 0 \\ \text{high-resistance insulation aging } p_{B1} > 0 \end{cases}.$$

In the formulas, $H_2$ denotes the insulation aging type of the point second closest to the primary monitoring device A.

If three insulation aging points are present, that is, Num=3, $$H_1 = \begin{cases} \text{low-resistance insulation aging } p_{A1} < 0 \\ \text{high-resistance insulation aging } p_{A1} > 0 \end{cases},$$

$$H_2 = \begin{cases} \text{low-resistance insulation aging } p_{A2} + p_{B2} < 0 \\ \text{high-resistance insulation aging } p_{A2} + p_{B2} > 0 \end{cases},$$

and $$H_3 = \begin{cases} \text{low-resistance insulation aging } p_{B1} < 0 \\ \text{high-resistance insulation aging } p_{B1} > 0 \end{cases}.$$

In the formulas, $H_3$ denotes the insulation aging type of the point third closest to the primary monitoring device A, $p_{A2}$ denotes the second element in the reflection energy information sequence $P_A$ calculated by the primary monitoring device A, and $p_{B2}$ denotes the second element in the reflection energy information sequence $P_B$ calculated by the secondary monitoring device B.

If four insulation aging points are present, that is, Num=4, $$H_1 = \begin{cases} \text{low-resistance insulation aging } p_{A1} < 0 \\ \text{high-resistance insulation aging } p_{A1} > 0 \end{cases},$$

$$H_2 = \begin{cases} \text{low-resistance insulation aging } p_{A2} < 0 \\ \text{high-resistance insulation aging } p_{A2} > 0 \end{cases},$$

$$H_3 = \begin{cases} \text{low-resistance insulation aging } p_{B2} < 0 \\ \text{high-resistance insulation aging } p_{B2} > 0 \end{cases},$$

and $$H_4 = \begin{cases} \text{low-resistance insulation aging } p_{B1} < 0 \\ \text{high-resistance insulation aging } p_{B1} > 0 \end{cases}.$$

In the formulas, $H_4$ denotes the insulation aging type of a point farthest from the primary monitoring device A.

In S34, after the number of insulation aging points is determined, the position of each insulation aging point is determined. The insulation aging position of the Num$^{th}$ aging point is determined by using the following formulas:

If one insulation aging point is present, that is, Num=1, $$Dist_1 = \frac{g_{A1} + g_{B1}}{2}.$$

In the formula, $Dist_1$ denotes the position of the insulation aging point closest to the primary monitoring device A, $g_{A1}$ denotes the first element in the reflection position information sequence $G_A$ calculated by the primary monitoring device A, and $g_{B1}$ denotes the first element in the reflection position information sequence $G_B$ calculated by the secondary monitoring device B.

If two insulation aging points are present, that is, Num=2, $$Dist_1 = \frac{g_{A1} + g_{B2}}{2}$$

$$Dist_2 = \frac{g_{A2} + g_{B1}}{2}.$$

In the formulas, $Dist_2$ denotes the position of the insulation aging point second closest to the primary monitoring device A, $g_{A1}$ and $g_{A2}$ denote the first element and the second element in the reflection position information sequence $G_A$ calculated by the primary monitoring device A respectively, and $g_{B1}$ and $g_{B2}$ denote the first element and the second element in the reflection position information sequence $G_B$ calculated by the secondary monitoring device B respectively.

If three insulation aging points are present, that is, Num=3, $$Dist_1 = g_{A1}$$

$$Dist_2 = \frac{g_{A2} + g_{B2}}{2}$$

$$Dist_3 = g_{B1}.$$

In the formulas, $Dist_3$ denotes the position of the insulation aging point third closest to the primary monitoring device A.

If four insulation aging points are present, that is, Num=4, $Dist_1 = g_{A1}$ $Dist_2 = g_{A2}.$ $Dist_3 = g_{B2}$ $Dist_4 = g_{B1}$ In the formulas, $Dist_4$ denotes the position of the insulation aging point farthest from the primary monitoring device A.

In S35, after the number of insulation aging points is determined, the aging degree of each insulation aging point is determined. The insulation aging degree of the Num$^{th}$ aging point is determined by using the following formulas:

If one insulation aging point is present, that is, Num=1, $$Sev_1 = \frac{p_{A1} + p_{B1}}{2}.$$

In the formula, $Sev_1$ denotes the aging degree of the insulation aging point closest to the primary monitoring device A, $p_{A1}$ denotes the first element in the reflection energy information sequence $P_A$ calculated by the primary monitoring device A, and $p_{B1}$ denotes the first element in the reflection energy information sequence $P_B$ calculated by the secondary monitoring device B.

If two insulation aging points are present, that is, Num=2, $$Sev_1 = \frac{p_{A1} + p_{B2}}{2}$$

$$Sev_2 = \frac{p_{A2} + p_{B1}}{2}.$$

In the formulas, $Sev_2$ denotes the aging degree of the insulation aging point second closest to the primary monitoring device A, $p_{A2}$ denotes the second element in the reflection energy information sequence $P_A$ calculated by the primary monitoring device A, and $p_{B2}$ denotes the second element in the reflection energy information sequence $P_B$ calculated by the secondary monitoring device B.

If three insulation aging points are present, that is, Num=3, $$Sev_1 = p_{A1}$$

$$Sev_2 = \frac{p_{A2} + p_{B2}}{2}$$

$$Sev_3 = p_{B1}$$

In the formulas, $Sev_3$ denotes the aging degree of the insulation aging point third closest to the primary monitoring device A.

If four insulation aging points are present, that is, Num=4, $Sev_1 = p_{A1}$ $Sev_2 = p_{A2}$.

$Sev_3 = p_{B2}$ $Sev_4 = p_{B1}$

In the formulas, $Sev_4$ denotes the aging degree of the insulation aging point farthest from the primary monitoring device A.

In S36, the value of Num is determined: if Num=Q, S37 is started; and if Num≠Q, Num is set to Num+1, and then S33 is started.

In S37, the detection is ended.

From the preceding, it can be seen that the present application provides an online monitoring method for insulation status of substation utility cables. This method can be used to determine whether there is insulation deterioration in a cable and accurately obtain the insulation status information of the current cable based on the calculated number of insulation aging points and the aging type, aging position, and aging degree of each insulation aging point. This facilitates a comprehensive assessment of the insulation status of the cable and provides a more reliable and accurate basis for cable monitoring and maintenance.

Moreover, the algorithm proposed in the present application can be implemented in power line communication devices in the related art simply after a firmware upgrade. Online monitoring of cables in medium-low voltage distribution networks can be achieved by utilizing extensive power line communication networks in the medium-low voltage distribution networks without the need for additional hardware. This method features a simple principle, cost-effectiveness, and ease of application.

What is claimed is:

1. An online monitoring method for insulation status of substation utility cables, comprising:

selecting a to-be-monitored cable; connecting one end of the to-be-monitored cable to a primary monitoring device through a first coupler and connecting the other end of the to-be-monitored cable to a secondary monitoring device through a second coupler, wherein one end of the to-be-monitored cable is connected to the primary monitoring device through the first coupler and the other end of the to-be-monitored cable is connected to the secondary monitoring device through the second coupler;

sending, by the primary monitoring device, a first high-frequency test signal and injecting the first high-frequency test signal into the to-be-monitored cable through the first coupler;

collecting, by the primary monitoring device, a first high-frequency reflected signal in the to-be-monitored cable through the first coupler, performing signal processing on the first high-frequency reflected signal by using a frequency-domain peak iterative search algorithm, and extracting first reflection point parameter information which is configured to characterize position and energy of a reflection point in the to-be-monitored cable corresponding to the first high-frequency reflected signal;

sending, by the secondary monitoring device, a second high-frequency test signal and injecting the second high-frequency test signal into the to-be-monitored cable through the second coupler;

collecting, by the secondary monitoring device, a second high-frequency reflected signal in the to-be-monitored cable by using through the second coupler, performing signal processing on the second high-frequency reflected signal by using the frequency-domain peak iterative search algorithm, and extracting second reflection point parameter information which is configured to characterize position and energy of a reflection point in the to-be-monitored cable corresponding to the second high-frequency reflected signal;

performing, by the primary monitoring device and the secondary monitoring device, information interaction, and after the second reflection point parameter information is acquired, determining insulation aging status of the to-be-monitored cable; and ending detection;

wherein the frequency-domain peak iterative search algorithm comprises:

inputting the first high-frequency reflected signal or the second high-frequency reflected signal into a divider to perform the signal processing; outputting a result of the signal processing and transferring the result to a Fast Fourier Transform (FFT) module; calculating a frequency-domain signal amplitude through an amplitude calculation module, a maximum amplitude search module, a maximum amplitude number storage module, and a maximum amplitude zeroing module in sequence; and performing two iterative searches and calculating, by a reflection information calculation module, the first reflection point parameter information or the second reflection point parameter information.

2. The online monitoring method for insulation status of substation utility cables according to claim 1, wherein the divider performs the signal processing by using the following formula:

$$a(i) = \frac{r(i)}{s(i)},$$

where $$i = 1, 2, \ldots N,$$

wherein a (i) denotes an $i^{th}$ element of an output sequence of the divider, r (i) denotes the first high-frequency reflected signal or the second high-frequency reflected signal, s (i) denotes an $i^{th}$ element of a sequence of the sent first high-frequency test signal or the sent second high-frequency test signal, i denotes a serial number of an element in a signal sequence, and N denotes a length of the signal sequence.

3. The online monitoring method for insulation status of substation utility cables according to claim 2, wherein the FFT module is configured to convert time-domain data into frequency-domain data by using the following formula:

$$b(k) = \sum_{i=1}^{N-1} a(i) \cdot e^{-j\cdot\frac{2\pi}{N}},$$

where $$k = 1, 2, \ldots N,$$

wherein b(k) denotes a $k^{th}$ element output by the FFT module, j denotes an imaginary unit, N denotes a length of an output sequence of the FFT module, and N is a length of a sequence of the first high-frequency test signal or a sequence of the second high-frequency test signal.

4. The online monitoring method for insulation status of substation utility cables according to claim 3, wherein the two iterative searches comprise:

receiving b (k) by the amplitude calculation module and performing the following calculation:

$c(k)=|b(k)|$, wherein $k=1,2, \ldots N;$ receiving c(k) by the maximum amplitude search module and performing a first search of amplitudes in c(k) to obtain a first maximum amplitude, and recording, by the maximum amplitude number storage module, a serial number of the first maximum amplitude as $l_1$, wherein $1 \leq l_1 \leq N$;

zeroing out, by the maximum amplitude zeroing module, the first maximum amplitude by using the following formula:

$$e(k) = \begin{cases} c(k) & k \neq l_1 \\ 0 & k = l_1 \end{cases}, \text{ wherein } k = 1, 2, \ldots N;$$

outputting e(k) to the maximum amplitude search module; and performing, by the maximum amplitude search module, a second search on e(k) to obtain a second maximum amplitude, and recording, by the maximum amplitude number storage module, a serial number of the second maximum amplitude as $l_2$, wherein $1 \leq l_2 \leq N$, wherein c(k) denotes a $k^{th}$ amplitude output by the amplitude calculation module, $|\cdot|$ denotes an amplitude operation, and e(k) denotes a $k^{th}$ amplitude of an output signal sequence of the maximum amplitude zeroing module.

5. The online monitoring method for insulation status of substation utility cables according to claim 4, wherein the reflection information calculation module calculates the first reflection point parameter information or the second reflection point parameter information by using the following formulas:

$P=(p_1,p_2)$, and $G=(g_1,g_2)$, wherein $p_1$ and $g_1$ are calculated from the serial number $l_1$ recorded after the first search:

$$p_1 = \begin{cases} b(l_1) & c(l_1) \geq T \\ 0 & c(l_1) < T \end{cases}, \text{ and}$$

$$g_1 = \begin{cases} l_1 \times \frac{v}{2 \cdot f} & c(l_1) \geq T \\ 0 & c(l_1) < T \end{cases};$$

$p_2$ and $g_2$ are calculated from the serial number $l_2$ recorded after the second search:

$$p_2 = \begin{cases} b(l_2) & c(l_2) \geq T \\ 0 & c(l_2) < T \end{cases}, \text{ and}$$

$$g_2 = \begin{cases} l_2 \times \frac{v}{2 \cdot f} & c(l_2) \geq T \\ 0 & c(l_2) < T \end{cases}; \text{ and}$$

based on a substitution of $p_{A1}$ and $p_{B1}$ into $p_1$, a substitution of $p_{B2}$ and $p_{A2}$ into $p_2$, a substitution of $g_{A1}$ and $g_{B1}$ into $g_1$, and a substitution of $g_{A2}$ and $g_{B2}$ into $g_2$, calculation is performed to obtain the first reflection point parameter information as follows:

$P_A=(P_{A1},P_{A2})$, $G_A=(g_{A1},g_{A2})$; and the second reflection point parameter information as follows:

$$\begin{cases} \text{present}, g_{A1} < L_C \text{ and } g_{B1} < L_C \\ \text{absent}, g_{A1} = g_{B1} = L_C \end{cases};$$

wherein P, $P_A$, and $P_B$ each denote a reflection energy information sequence, $p_1$ and $p_2$ are elements in P, $p_{A1}$ and $p_{A2}$ are elements in $P_A$, and $p_{B1}$ and $p_{B2}$ are elements in $P_B$; G, $G_A$, and $G_B$ each denote a reflection position information sequence, $g_1$ and $g_2$ are elements in G, $g_{A1}$ and $g_{A2}$ are elements in $G_A$, and $g_{B1}$ and $g_{B2}$ are elements in $G_B$; $b(l_1)$ denotes an $l_1^{th}$ element output by the FFT module, $c(l_1)$ denotes an $l_1^{th}$ element output by the amplitude calculation module, T denotes a threshold, v denotes a transmission speed of a high-frequency signal in cables, and $f_s$ denotes a sampling rate of a device; and $b(l_2)$ denotes an $l_2^{th}$ element output by the FFT module, and $c(l_2)$ denotes an $l_2^{th}$ element output by the amplitude calculation module.

6. The online monitoring method for insulation status of substation utility cables according to claim 5, wherein determining the insulation aging status of the to-be-monitored cable comprises:
   determining whether the to-be-monitored cable undergoes insulation aging;
   in response to a determination result that the to-be-monitored cable undergoes no insulation aging, ending the detection;
   in response to a determination result that the to-be-monitored cable undergoes insulation aging, calculating a number Q of insulation aging points;
   initializing Num to 1, and determining an insulation aging type of a Num$^{th}$ aging point among the Q insulation aging points;
   determining an insulation aging position of the Num$^{th}$ aging point;
   determining an insulation aging degree of the Num$^{th}$ aging point;
   determining a value of Num;
   in response to a determination result that Num=Q, ending the detection; and
   in response to a determination result that Num≠Q, setting Num to Num+1 and returning to the step of determining the insulation aging type of the Num$^{th}$ aging point.

7. The online monitoring method for insulation status of substation utility cables according to claim 6, wherein whether the to-be-monitored cable undergoes insulation aging is determined by using the following formula:

$$\begin{cases} \text{present,} & g_{A1} < L_c \text{ and } g_{B1} < L_c \\ \text{absent,} & g_{A1} = g_{B1} = L_c \end{cases};$$

and
   in response to the determination result that the to-be-monitored cable undergoes the insulation aging, determining the number Q of insulation aging points as ΣNum, wherein $$Num = \begin{cases} 1 & g_{A1} + g_{B1} = L_C \\ 2 & g_{A1} + g_{B1} = L_C \\ 3 & g_{A2} + g_{B2} = L_C \\ 4 & g_{A2} + g_{B2} < L_C \end{cases},$$

where $g_{A1}$ and $g_{A2}$ denote a first element and a second element in the reflection position information sequence $G_A$ calculated by the primary monitoring device respectively, $g_{B1}$ and $g_{B2}$ denote a first element and a second element in the reflection position information sequence $G_B$ calculated by the secondary monitoring device respectively, and $L_C$ denotes a length of the to-be-monitored cable.

8. The online monitoring method for insulation status of substation utility cables according to claim 7, wherein determining the insulation aging type of the Num$^{th}$ aging point comprises:
   in response to determining that one insulation aging point is present, and Num=1, determining the insulation aging type of the Num$^{th}$ aging point by using the following formula:

$$H_1 = \begin{cases} \text{low−restistance insulation aging } p_{A1} + p_{B1} < 0 \\ \text{high−restistance insulation aging } p_{A1} + p_{B1} > 0 \end{cases};$$

in response to determining that two insulation aging points are present, and Num=2, determining the insulation aging type of the Num$^{th}$ aging point by using the following formulas:

$$H_1 = \begin{cases} \text{low−restistance insulation aging } p_{A1} < 0 \\ \text{high−restistance insulation aging } p_{A1} > 0 \end{cases}, \text{ and}$$

$$H_2 = \begin{cases} \text{low−restistance insulation aging } p_{B1} < 0 \\ \text{high−restistance insulation aging } p_{B1} > 0 \end{cases};$$

in response to determining that three insulation aging points are present, and Num=3, determining the insulation aging type of the Num$^{th}$ aging point by using the following formulas:

$$H_1 = \begin{cases} \text{low−restistance insulation aging } p_{A1} < 0 \\ \text{high−restistance insulation aging } p_{A1} > 0 \end{cases},$$

$$H_2 = \begin{cases} \text{low−restistance insulation aging } p_{A2} + p_{B2} < 0 \\ \text{high−restistance insulation aging } p_{A2} + p_{B2} > 0 \end{cases}, \text{ and}$$

$$H_3 = \begin{cases} \text{low−restistance insulation aging } p_{B1} < 0 \\ \text{high−restistance insulation aging } p_{B1} > 0 \end{cases};$$

in response to determining that four insulation aging points are present, and Num=4, determining the insulation aging type of the Num$^{th}$ aging point by using the following formulas:

$$H_1 = \begin{cases} \text{low−restistance insulation aging } p_{A1} < 0 \\ \text{high−restistance insulation aging } p_{A1} > 0 \end{cases},$$

$$H_2 = \begin{cases} \text{low−restistance insulation aging } p_{A2} < 0 \\ \text{high−restistance insulation aging } p_{A2} > 0 \end{cases},$$

$$H_3 = \begin{cases} \text{low−restistance insulation aging } p_{B2} < 0 \\ \text{high−restistance insulation aging } p_{B2} > 0 \end{cases}, \text{ and}$$

$$H_4 = \begin{cases} \text{low−restistance insulation aging } p_{B1} < 0 \\ \text{high−restistance insulation aging } p_{B1} > 0 \end{cases};$$

wherein $H_1$, $H_2$, $H_3$, and $H_4$ denote an insulation aging type of an insulation aging point closest to the primary monitoring device, an insulation aging type of an insulation aging point second closest to the primary monitoring device, an insulation aging type of an insulation aging point third closest to the primary monitoring device, and an insulation aging type of an insulation aging point farthest from the primary monitoring device respectively, $p_{A1}$ and $p_{A2}$ denote a first element and a second element in the reflection energy information sequence $P_A$ calculated by the primary monitoring device respectively, and $p_{B1}$ and $p_{B2}$ denote a first element and a second element in the reflection energy information sequence $P_B$ calculated by the secondary monitoring device respectively; and determining the insulation aging degree of the Num$^{th}$ aging point comprises:

in response to determining that one insulation aging point is present, and Num=1, determining the insulation aging degree of the Num$^{th}$ aging point by using the following formula:

$$Dist_l = \frac{g_{A1} + g_{B1}}{2}$$

in response to determining that two insulation aging points are present, and Num=2, determining the insulation aging degree of the $Num^{th}$ aging point by using the following formulas:

$$Dist_1 = \frac{g_{A1} + g_{B2}}{2}$$
$$Dist_2 = \frac{g_{A2} + g_{B1}}{2};$$

in response to determining that three insulation aging points are present, and Num=3, determining the insulation aging degree of the $Num^{th}$ aging point by using the following formulas:

$$Dist_1 = g_{A1}$$
$$Dist_2 = \frac{g_{A2} + g_{B2}}{2}; \text{ and}$$
$$Dist_3 = g_{B1}$$

in response to determining that four insulation aging points are present, and Num=4, determining the insulation aging degree of the $Num^{th}$ aging point by using the following formulas:

$Dist_1 = g_{A1}$ $Dist_2 = g_{A2}$, $Dist_3 = g_{B2}$ $Dist_4 = g_{B1}$ wherein $Dist_1$, $Dist_2$, $Dist_3$, and $Dist_4$ denote a position of the insulation aging point closest to the primary monitoring device, a position of the insulation aging point second closest to the primary monitoring device, a position of the insulation aging point third closest to the primary monitoring device, and a position of the insulation aging point farthest from the primary monitoring device respectively.

9. The online monitoring method for insulation status of substation utility cables according to claim 8, wherein determining the insulation aging degree of the $Num^{th}$ aging point comprises:

in response to determining that one insulation aging point is present, and Num=1, determining the insulation aging degree of the $Num^{th}$ aging point by using the following formula:

$$Sev_1 = \frac{p_{A1} + p_{B1}}{2};$$

in response to determining that two insulation aging points are present, and Num=2, determining the insulation aging degree of the $Num^{th}$ aging point by using the following formulas:

$$Sev_1 = \frac{p_{A1} + p_{B2}}{2}$$
$$Sev_2 = \frac{p_{A2} + p_{B1}}{2};$$

in response to determining that three insulation aging points are present, and Num=3, determining the insulation aging degree of the $Num^{th}$ aging point by using the following formulas:

$$Sev_1 = p_{A1}$$
$$Sev_2 = \frac{p_{A2} + p_{B2}}{2}; \text{ and}$$
$$Sev_3 = p_{B1}$$

in response to determining that four insulation aging points are present, and Num=4, determining the insulation aging degree of the $Num^{th}$ aging point by using the following formulas:

$Sev_1 = p_{A1}$ $Sev_2 = p_{A2}$, $Sev_3 = p_{B2}$ $Sev_4 = p_{B1}$ wherein $Sev_1$, $Sev_2$, $Sev_3$, and $Sev_4$ denote an aging degree of the insulation aging point closest to the primary monitoring device, an aging degree of the insulation aging point second closest to the primary monitoring device, an aging degree of the insulation aging point third closest to the primary monitoring device, and an aging degree of the insulation aging point farthest from the primary monitoring device respectively.

\* \* \* \* \*